United States Patent [19]

Sauer

[11] Patent Number: 4,933,646
[45] Date of Patent: Jun. 12, 1990

[54] FIELD EFFECT TRANSISTOR LIMITER CIRCUITRY

[75] Inventor: Donald J. Sauer, Allentown, N.J.

[73] Assignee: RCA Licensing Corporation, Princeton, N.J.

[21] Appl. No.: 329,161

[22] Filed: Mar. 27, 1989

[51] Int. Cl.$^5$ .............................................. H03F 3/16
[52] U.S. Cl. .................................... 330/277; 330/253
[58] Field of Search ................. 307/590, 594; 330/253, 330/257, 277, 284, 300, 311

[56] References Cited

U.S. PATENT DOCUMENTS

| | | | |
|---|---|---|---|
| 3,027,466 | 3/1962 | Roalef | 307/88.5 |
| 4,068,090 | 1/1978 | Komatsu et al. | 330/277 X |
| 4,249,095 | 2/1981 | Hsu | 330/253 X |
| 4,348,643 | 9/1982 | Tennison | 330/294 |
| 4,371,749 | 2/1983 | Lind | 179/1 GS |
| 4,464,635 | 8/1984 | Rypkema | 330/284 |

OTHER PUBLICATIONS

J. Millman & H. Taub, Pulse Digital, and Switching Waveform, McGraw Hill Inc., 1965, pp. 225 to 248.

Primary Examiner—Steven Mottola
Attorney, Agent, or Firm—Joseph S. Tripoli; Eric P. Herrmann; James B. Hayes

[57] ABSTRACT

An amplifier/limiter circuit includes an amplifier providing an output signal having a potential range between ground and $V_D$ volts. A first pair of parallel connected complementary transistors have their principal conduction paths coupled between the output terminal of the amplifier and an amplifier/limiter output terminal. A second pair of parallel connected complementary transistors have their principal conduction paths coupled between the amplifier/limiter output terminal and a point of reference potential having a potential value between $V_D$ and ground. The amplifier/limiter output terminal provides a linear, amplified version of signal provided to the amplifier circuit over a limited range of potentials between $V_D$ and ground, which range is less than $V_D$.

7 Claims, 2 Drawing Sheets

FIELD EFFECT TRANSISTOR LIMITER CIRCUITRY

This invention relates to electronic signal limiter circuitry.

BACKGROUND OF THE INVENTION

Limiting circuits are well known and generally include a nonlinear element biased to selectively conduct or not conduct above or below the bias range. Alternatively, limiting circuits may be arranged as amplifiers with limited supply potentials causing the output swing of the limiting amplifiers to saturate at the desired input clipping level. See, for example, Millman and Taub, *Pulse, Digital, and Switching Waveforms*, McGraw Hill, N.Y., 1965, Chapter 7.

Situations arise, however, where the more traditional limiter circuits are not practical. For example, low voltage battery operated circuitry may not provide sufficient operating potential to permit the operation of saturating amplifiers as limiters or to realize sufficient linear performance from nonlinear limiting devices (diodes). Further, it may be desired to have the limiter provide an output within some nominal range of potentials.

SUMMARY OF THE INVENTION

The present invention is a field effect transistor (FET) amplifier/limiter circuit for maintaining a limited signal within a particular range of potentials. The circuitry includes an amplifier driving a pair of cascade coupled transmission gates, the opposite end of which is biased to one half the supply potential. The control electrodes of the transmission gates are connected to respective supply potentials. Output signal is taken from the interconnection of the cascade coupled transmission gates. The potential swing of the output signal is constrained to a potential range less than the supply potential.

DETAILED DESCRIPTION

Figure 1:
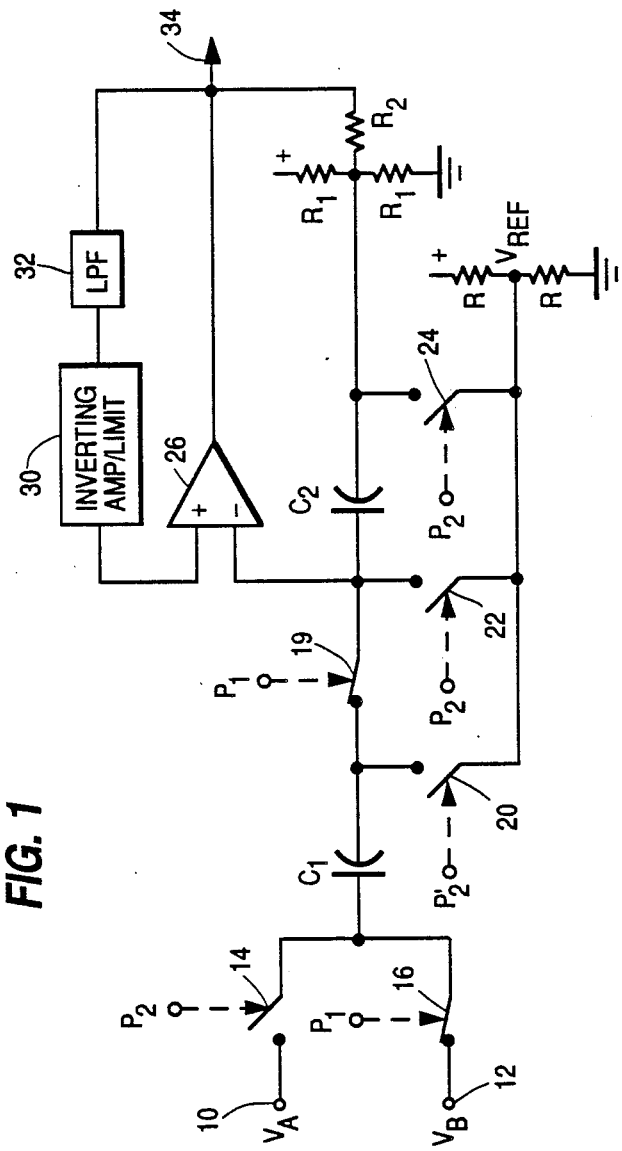
FIG. 1 is a circuit diagram including the amplifier limiter, embodying the invention, in an exemplary environment in which it may be used.

Referring to FIG. 1, a differential amplifier 26 is coupled in a configuration to develop the difference between two signals VA and VB. In this arrangement a first feedback circuit including a low pass filter 32 and a limiting amplifier 30, connected between the output and noninverting input of amplifier 26, D.C. biases the amplifier near its optimum operating point. The D.C. operating potential coupled to the inverting input connection of amplifier 26 is equal to one-half the amplifier supply potential. Since the inverting input terminal is D.C. biased at half supply potential, it is desirable, to, e.g., prevent amplifier latchup, to limit the output potential of the feedback amplifier 30 to a range of values about half the supply potential.

A second feedback circuit, including resistors R1, R2 and capacitor C2, is coupled between the output and inverting input terminal of the amplifier 26. The resistors R1 and R2 establish the gain of the circuit at a value of $1+2R_2R_1$. Signal is coupled to the inverting input terminal via capacitor C1 and switches 14, 16 and 19. The capacitors C1 and C2 have equal values so that the circuit gain is dependent only upon the resistance values of resistors R1 and R2.

Circuit operation proceeds as follows. Switches 14, 20, 22 and 24 are concurrently closed under the control of clock signals P2' and P2. Switches 20, 22 and 24, each having a terminal coupled to a reference potential, apply the reference potential to both electrodes of capacitor C2 and one electrode of capacitor C1. This action auto-zeroes the amplifier to its midrange operating point. Simultaneously, switch 14 couples the signal VA to the second electrode of capacitor C1.

During the interval that switches 14, 20, 22 and 24 are closed, switches 16 and 19 are open circuited. Switches 14, 20, 22 and 24 are then open circuited and switches 16 and 19 are closed under the control of clock signal P1. Signal VA is decoupled from and signal VB coupled to, capacitor C1 and capacitor C1 is coupled to the inverting input terminal of amplifier 26. Any potential difference between signals VA and VB will cause a current to flow in capacitors C1 and C2. This current establishes a change in charge $\Delta Q$ stored on capacitor C2, creating a potential change $(VA-VB)=\Delta Q/C2$ at the inverting input terminal of amplifier 26. This potential is amplified and output at terminal 34.

The clock signals P1 and P2 which control the respective switches exhibit substantially antiphase, nonoverlapping, rectangular waveforms. Clock signal P2' occurs concurrently with pulses of the clock signal P2. If it is desired to capture the value of the signal VA at narrowly defined instants in time, pulses of the signal P2' must be made narrow. For example, if the bandwidth of the circuit is in the order of 7 megahertz, and the clock signals P1, P2 and P2' are in the order of 14 megahertz to satisfy the Nyquist sampling criterion, the pulses of the clock signal P2' will be of the order of 5-10 nanoseconds. Alternatively, if the input signals VA and VB are substantially D.C. signals, then clock signal P2 can be substituted for signal P2'.

The lowpass filter 32 is a switched capacitor filter which samples the potential on output terminal 34 during the auto-zero intervals. Filter 32 averages the auto-zeroed output potentials to provide a feedback potential to correct for input offset potentials in amplifier 26, that is, to prevent D.C. signal components from affecting the output bias potential.

Figure 2:
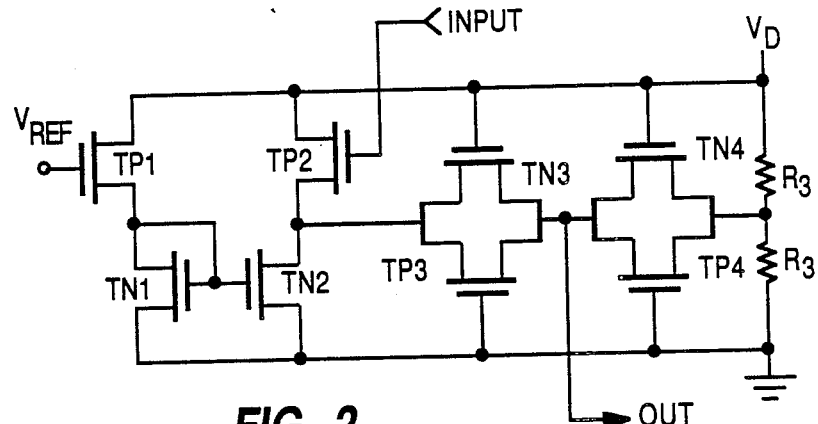
FIGS. 2 and 3 are schematic diagrams of alternative amplifier/limiter circuitry embodying the invention.

The amplifier/limiter 30 is illustrated in FIG. 2. This circuit includes a P-type field effect transistor, TP2 arranged as a common source amplifier. A complementary N-type field effect transistor, TN2, biased as a current source is connected as a load device to transistor TP2. Output signals from the common source amplifier are taken from the interconnection of transistors TP2 and TN2.

Bias potential for the gate electrode of transistor TN2 is provided by the gate-drain connection of a further N-type transistor TN1. Transistors TN1 and TN2 are arranged in the well known current mirror configuration. Operating current for transistor TN1 is provided by the drain current of a further P-type transistor TP1. The gate electrode of transistor TP1 is provided with a reference potential, for example, a potential equal to one-half the supply potential coupled across transistors TP2 and TN2. Nominally the transistors TP2, TN2 and TP1, TN1 are designed to have complementary characteristics and the ratio of the geometries (and thereby the transconductances) of transistors TP1:TP2 is equal to the ratio of the geometries of TN1:TN2. If these conditions are satisfied and a reference potential of one-half the supply potential is applied to the gate electrode of transistor TP1, then the D.C. output potential of the common source amplifier will be equal to one-half the supply potential.

The output connection of the common source amplifier is coupled to the primary conduction paths of the parallel connection of a P-type transistor TP3 and an N-type transistor TN3. The gate electrodes of the transistors TP3 and TN3 are coupled to the relatively negative (ground) and relatively positive ($V_D$) supply potentials. The primary conduction paths of the parallel connected transistors TN3 and TP3 are coupled to the primary conduction paths of the parallel connection of a further P-type transistor, TP4, and a further N-type transistor, TN4. The other end of the primary conduction paths of transistors TP4 and TN4 is coupled to the interconnection of a series connected pair of like resistances, R3, which are connected across the supply potentials. As such, a potential equal to one half the supply potential is applied to the primary conduction path of transistor TN4 and TP4. The gate electrodes of transistors TP4 and TN4 are respectively coupled to the relatively negative and relatively positive supply potentials.

Input signal to the amplifier/limiter circuit is coupled to the gate electrode of transistor TP2. Output signal, OUT, from the circuit is taken from the interconnection of transistors TN3 and TN4 (TP3, TP4).

The transistors TN3, TP3 and TN4, TP4 are arranged such that at least one of the transistors of each parallel pair is biased into conduction. Therefore, the parallel pairs of transistors provide an effective resistive impedance which will be designated $R_e$. The series connected resistors R3 present a Thevenin resistance of $R3/2$ in series with a Thevenin potential of $V_{D/2}$. The common source amplifier will present an inherent output impedance which will be designated Ro. Assume that the Thevenin resistance $R3/2$ is equal to $\alpha Ro$, and that the output potential provided by the amplifier is $e_o$. With this set of conditions the potential OUT can be expressed by the equation.

$$\text{OUT} = \frac{e_o/2(1 + \alpha R_o/R_e)}{1 + R_o(1 + \alpha)/2R_e} + \frac{V_D/4(1 + R_o/R_e)}{1 + R_o(1 + \alpha)/2R_e} \quad (1)$$

If the factor $\alpha$ is equal to one, equation 1 reduces to $$\text{OUT} = e_o/2 + V_D/4 \quad (2)$$

The maximum and minimum potential values that $e_o$ can exhibit are $V_D$ and zero (ground) respectively. Therefore, the maximum and minimum potential values that the signal OUT can exhibit are $3V_D/4$ and $V_D/4$ respectively.

Figure 4:
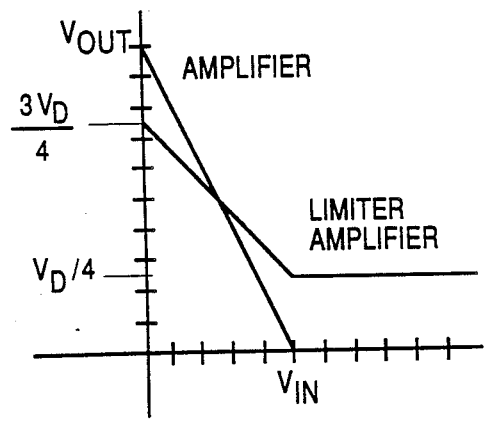
FIG. 4 is a graph showing the transfer function characteristic of the FIG. 2 circuitry.

FIG. 4 shows the transfer function of the FIG. 2 circuitry for the common source amplifier exhibiting a gain of two and for $\alpha$ equal to one. For $\alpha$ close to the value one, and/or $R_e >> R_o$ the limits will be equal to or close to $3V_D/4$ and $V_D/4$. As $\alpha$ gets large the limiting potentials approach the supply potentials. In the linear region the gain of the amplifier/limiter circuit is approximately one-half the gain of the amplifier alone.

In the FIG. 2 circuit the potential $V_{ref}$ may be taken from the interconnection of the series connected resistors R3. The resistances R3 may be realized by D.C. biased transistors.

Figure 3:
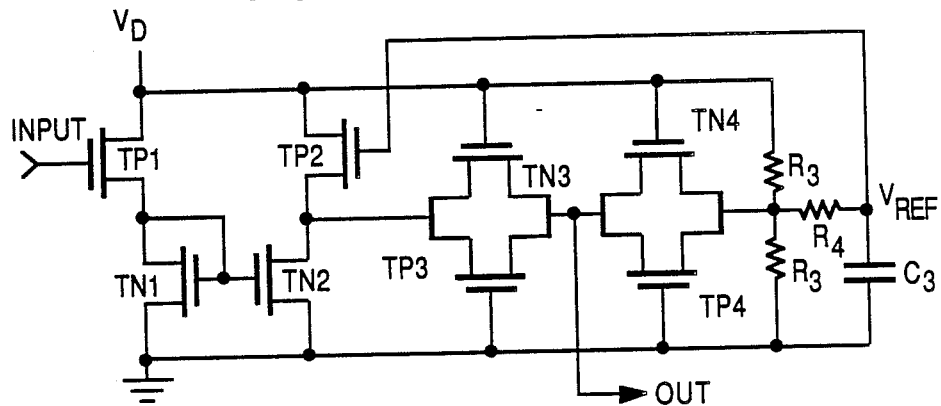

FIG. 3 is a noninverting amplifier limiter. In this arrangement the transistor TP1 is configured as a common source input amplifier, driving a current mirror amplifier comprising transistors TN1 and TN2. Transistor TP2 having a potential $V_{ref}$ coupled to its gate electrode operates as a current source load device for transistor TN2. Note an increasing input potential applied to P-type transistor TP1 causes a decreasing drain current in transistor TP1 and thereby a decreasing current in transistor TN1. The decreasing current in transistor TN1 is reflected in transistor TN2 resulting in an increasing output potential at the interconnection between transistors TP2 and TN2. The gate electrode of transistor TP2 is coupled via a low pass filter (R4, C3) to the interconnection of resistors R3. The low pass filter is added to attenuate any signal potential which may be coupled to the interconnection of resistors R3 via transistors TP3, TN3, TP4, and TN4.

What is claimed is:

1. In combination:
   a source of relatively positive and relatively negative supply potential;
   an amplifier connected across said relatively positive and relatively negative supply potentials, having an input terminal for applying an input signal and having an output terminal;
   a first pair of transistors having respective principal conduction paths coupled in parallel between said output terminal of said amplifier and a circuit output terminal, and having respective control electrodes coupled to at least one of said relatively positive and relatively negative supply potentials;
   a second pair of transistors having respective principal conduction paths coupled in parallel between said circuit output terminal and a point of substantially constant reference potential having a value between said relatively positive and relatively negative supply potential, and having respective control electrodes coupled to at least one of said relatively positive and relatively negative supply potentials.

2. The combination set forth in claim 1 wherein each pair of transistors comprises a P-type field effect transistor and an N-type field effect transistor having respective gate electrodes coupled to the relatively negative and relatively positive supply potentials, respectively.

3. In combination:
   a source of relatively positive and relatively negative supply potential;
   an amplifier connected across said relatively positive and relatively negative supply potentials, having an input terminal for applying an input signal and having an output terminal;
   a first pair of transistors having respective principal conduction paths coupled in parallel between said output terminal of said amplifier and a circuit output terminal, and having respective control electrodes coupled to at least one of said relatively positive and relatively negative supply potentials;
   a second pair of transistors having respective principal conduction paths coupled in parallel between said circuit output terminal and a circuit node, and having respective control electrodes coupled to at least one of said relatively positive and relatively negative supply potentials; and first resistance means coupled between said relatively positive supply potential and said circuit node, and second resistance means coupled between said circuit node and said relatively negative supply potential for generating a substantially constant reference potential at said circuit node.

4. The combination set forth in claim 3 wherein said amplifier comprises:
   a first field effect transistor of a first conductivity type arranged as a common source amplifier; and
   a second field effect transistor of opposite conductivity type, biased as a current source; and wherein the principal conduction paths of said first and second field effect transistors are serially coupled between said relatively positive and relatively negative supply potentials.

5. In combination;
   a source of relatively positive and relatively negative supply potential;
   a first amplifier connected across said relatively positive and relatively negative supply potentials, having an input terminal for applying an input signal and having an output terminal;
   a first pair of transistors having respective principal conduction paths coupled in parallel between said output terminal of said amplifier and a circuit output terminal, and having respective control electrodes coupled to at least one of said relatively positive and relatively negative supply potentials;
   a second pair of transistors having respective principal conduction paths coupled in parallel between said circuit output terminal and a point of substantially constant reference potential, and having respective control electrodes coupled to at least one of said relatively positive and relatively negative supply potentials;
   a low pass filter;
   a differential amplifier having inverting and noninverting input terminals and an output terminal;
   means serially coupling said lowpass filter with said first amplifier between the output terminal and noninverting input terminal of said differential amplifier for providing feedback around said differential amplifier; and
   means for providing an input signal to the inverting input terminal of said differential amplifier.

6. The combination set forth in claim 5 further including a capacitor coupled between the output terminal and inverting input terminal of said differential amplifier.

7. The combination set forth in claim 6 wherein said means for providing input signal comprises:
   first and second signal sources;
   a further capacitor having a first electrode coupled to said inverting input terminal and having a second electrode; and
   means for alternately coupling said first and second signal sources to the second electrode of said further capacitor.

* * * * *